US011569155B2

(12) United States Patent
Liao et al.

(10) Patent No.: US 11,569,155 B2
(45) Date of Patent: Jan. 31, 2023

(54) SUBSTRATE BONDING PAD HAVING A MULTI-SURFACE TRACE INTERFACE

(71) Applicant: Western Digital Technologies, Inc., San Jose, CA (US)

(72) Inventors: Chih-Chin Liao, Changhua (TW); Cheng-Hsiung Yang, Hsinchu (TW)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/343,069

(22) Filed: Jun. 9, 2021

(65) Prior Publication Data
US 2022/0399258 A1    Dec. 15, 2022

(51) Int. Cl.
  *H05K 1/11*    (2006.01)
  *H01L 23/498*    (2006.01)

(52) U.S. Cl.
  CPC ......... *H01L 23/49811* (2013.01); *H01L 23/49866* (2013.01); *H05K 1/111* (2013.01);
  (Continued)

(58) Field of Classification Search
  CPC ......... H01L 23/49811; H01L 23/49866; H01L 24/16; H01L 24/48; H01L 24/45; H01L 2224/16237; H01L 2224/45144; H01L 2224/48227; H01L 2224/48228; H05K 1/111; H05K 2201/10734; H05K 3/243; H05K 3/3452; H05K 2201/09172;
  (Continued)

(56) References Cited

U.S. PATENT DOCUMENTS

| 5,707,714 | A | * | 1/1998 | Furutatsu | ............. | H05K 3/3468 428/209 |
| 5,872,399 | A | | 2/1999 | Lee | | |
| 6,115,262 | A | * | 9/2000 | Brunner | ............... | H05K 3/3442 361/772 |

(Continued)

FOREIGN PATENT DOCUMENTS

| EP | 1473977 A2 | 11/2004 |
| JP | 2005197496 A | 7/2005 |

(Continued)

OTHER PUBLICATIONS

Varun Soman et al., "Reliability Challenges in Fabrication of Flexible Hybrid Electronics for Human Performance Monitors: A System Level Study", IEEE, 16 pages.

*Primary Examiner* — Steven T Sawyer
(74) *Attorney, Agent, or Firm* — Morgan, Lewis & Bockius LLP

(57) ABSTRACT

A bonding pad such as for a ball grid array includes a conductive pad having a top surface and a first interface surface in contact with a signal trace of a substrate, and a plating layer having a bottom surface in direct contact with the top surface of the conductive pad. The plating layer includes one or more protrusions extending toward the signal trace in a direction generally parallel to a longitudinal axis of the signal trace. Each of the one or more protrusions includes two parallel sidewalls extending upwardly from the bottom surface of the plating layer, and a second interface surface contiguous with the bottom surface of the plating layer. The second interface surface is positioned over and in direct contact with a top surface of the signal trace. The protrusions prevent the connection to the signal trace from being compromised.

18 Claims, 7 Drawing Sheets

(52) U.S. Cl.
CPC ............... *H05K 2201/099* (2013.01); *H05K 2201/0989* (2013.01); *H05K 2201/10734* (2013.01)

(58) Field of Classification Search
CPC .............. H05K 2201/09181; H05K 2201/099; H05K 2201/09381; H05K 2201/0989
See application file for complete search history.

(56) References Cited

U.S. PATENT DOCUMENTS

| | | | | |
|---|---|---|---|---|
| 6,250,606 | B1 * | 6/2001 | Juso | H05K 3/3436 |
| | | | | 257/774 |
| 6,280,828 | B1 * | 8/2001 | Nakatsuka | H05K 3/244 |
| | | | | 428/209 |
| 6,930,044 | B1 * | 8/2005 | Weng | H05K 3/243 |
| | | | | 438/686 |
| 7,005,750 | B2 | 2/2006 | Liu | |
| 7,064,435 | B2 | 6/2006 | Chung et al. | |
| 9,113,564 | B2 * | 8/2015 | Ootani | H05K 1/111 |
| 9,536,850 | B2 | 1/2017 | Yu et al. | |
| 2005/0039944 | A1 * | 2/2005 | Kim | H05K 3/3452 |
| | | | | 174/250 |
| 2007/0085217 | A1 * | 4/2007 | Sorimachi | H05K 1/111 |
| | | | | 257/778 |
| 2008/0136033 | A1 * | 6/2008 | Nagamatsu | H01L 23/3128 |
| | | | | 174/257 |
| 2008/0290510 | A1 | 11/2008 | Audet et al. | |
| 2009/0096099 | A1 * | 4/2009 | Hsu | H05K 3/244 |
| | | | | 257/738 |
| 2010/0030073 | A1 | 12/2010 | Kalafut | |

FOREIGN PATENT DOCUMENTS

| | | |
|---|---|---|
| KR | 101383898 B1 | 4/2014 |
| KR | 101669535 B1 | 11/2016 |

* cited by examiner

SUBSTRATE BONDING PAD HAVING A MULTI-SURFACE TRACE INTERFACE

BACKGROUND

The present disclosure generally relates to semiconductor chip packaging and, more particularly, to a bonding pad for interconnecting a packaged semiconductor device to a printed circuit board and the manufacture thereof.

Substrates used in electronic packages have been and continue to be developed for many applications. Such substrates often include a surface for redistributing electrical signals from a semiconductor die mounted on the substrate to a larger area such that the substrate can properly interface with a hosting printed circuit board having said larger area. Such substrates include external conductive layers, which are used to electrically couple the semiconductor die to the printed circuit board such as with industry standard ball grid arrays (BGA), which include solder ball interconnections.

For substrates, including semiconductor device carriers and printed circuit boards, the materials making up the substrates have some structural flexibility. However, flexible materials have some limitations on the amount of mechanical strain that can be tolerated until the material fractures and fails. During manufacture of an electronic package and its assembly to a printed circuit board, many sources of package substrate (laminate) and printed circuit board flexure exist. Such sources may include the manual handling through assembly, placing the printed circuit board into tooling fixtures, assembling other components onto the printed circuit board, the use of pressure-probes for electrical testing, and thermal expansion of semiconductor chips, package laminate substrates, and the printed circuit board during manufacture and use. As a result, interconnections between the substrate bonding pad (e.g., a BGA bonding pad) and a trace of the substrate may be subject to high stresses, which may cause deterioration, such as cracking or partial separation, which can cause failure of the formed connection. Additionally, the chance of such a deterioration may increase as miniaturization has caused the thickness of a conductive trace of the BGA pad to be decreased. Therefore, there is a need to provide a system and/or method of preventing and/or reducing the deterioration of interconnections between bonding pads and the substrate traces to which they are connected.

SUMMARY

In one embodiment there is a bonding pad that includes a conductive pad having a first interface surface in contact with a signal trace of a substrate, and a plating layer having a bottom surface in direct contact with the conductive pad, and one or more protrusions extending toward the signal trace in a direction generally parallel to a longitudinal axis of the signal trace. Each of the one or more protrusions include two parallel sidewalls extending upwardly from the bottom surface of the plating layer, and a second interface surface contiguous with the bottom surface of the plating layer, the second interface surface being disposed over and in direct contact with a top surface of the signal trace. In some embodiments, the plating layer is a nickel-gold plating layer. In some embodiments, the one or more protrusions includes a first protrusion and a second protrusion. In some embodiments, the first protrusion and second protrusion extend outwardly from the plating layer generally parallel to one another. In some embodiments, the first protrusion and second protrusion extend outwardly from the plating layer at generally the same length.

In some embodiments, the first protrusion and second protrusion extend outwardly from the plating layer at unequal lengths. In some embodiments, the first protrusion and second protrusion are symmetric about the longitudinal axis. In some embodiments, the first protrusion has a width extending in a direction perpendicular to the longitudinal axis and second protrusion has a width extending in a direction perpendicular to the longitudinal axis, wherein a combined width of the first protrusion and second protrusion is less than a width of the signal trace. In some embodiments, the one or more protrusions have a width extending in a direction perpendicular to the longitudinal axis and which is less than a width of the signal trace. In some embodiments, the one or more protrusions have a generally rectangular cross-sectional shape. In some embodiments, a top surface of the one or more protrusions is covered by a solder mask of the substrate. In some embodiments, the one or more protrusions extend into one or more apertures defined by a solder mask of the substrate.

In another embodiment there is a substrate bonding pad including conducting means for electrically coupling a solder ball to a trace of the substrate, the conducting means having a first interface means for electrically connecting to the trace, and plating means covering a surface of the conducting means for protecting the conducting means from corrosion and/or providing strength to the conducting means, the plating means electrically coupling the solder ball to the conducting means, the plating means having protrusion means for directly contacting the trace, the protrusion means having a second interface means for electrically connecting to the trace separate and distinct from the first interface means. In some embodiments, the plating means comprises a first plating means and a second plating means for directly contacting the trace of the substrate with second and third interface surface areas respectively. In some embodiments, the second and third interface surface areas are about equal. In some embodiments, the second and third interface surface areas are unequal.

In another embodiment there is a substrate including an insulating layer configured to provide electrical insulation between electrically conductive elements of the substrate, a signal trace coupled to a top surface of the insulating layer, a solder mask in direct contact with a top surface of the signal trace, the solder mask defining a solder mask opening, and a bonding pad positioned within the solder mask opening, the bonding pad configured to directly contact the signal trace within two or more interface surface areas, the two or more interface surface areas being separate and distinct from one another. The bonding pad includes a conductive pad having a top surface and a first interface surface in contact with a signal trace of a substrate, and a plating layer having a bottom surface in direct contact with the conductive pad, and one or more protrusions extending toward the signal trace in a direction generally parallel to a longitudinal axis of the signal trace. Each of the one or more protrusions include two parallel sidewalls extending upwardly from the bottom surface of the plating layer, and a second interface surface contiguous with the bottom surface of the plating layer, the second interface surface being disposed over and in direct contact with a top surface of the signal trace. In some embodiments, the solder mask opening includes one or more apertures configured to receive the one or more protrusions of the ball grid array pad. In some embodiments, the one or more protrusions includes a first protrusion and a second protrusion spaced from one another in a direction perpendicular to the longitudinal axis. In some embodiments, a top surface of the one or more protrusions is covered by the solder mask.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1A:
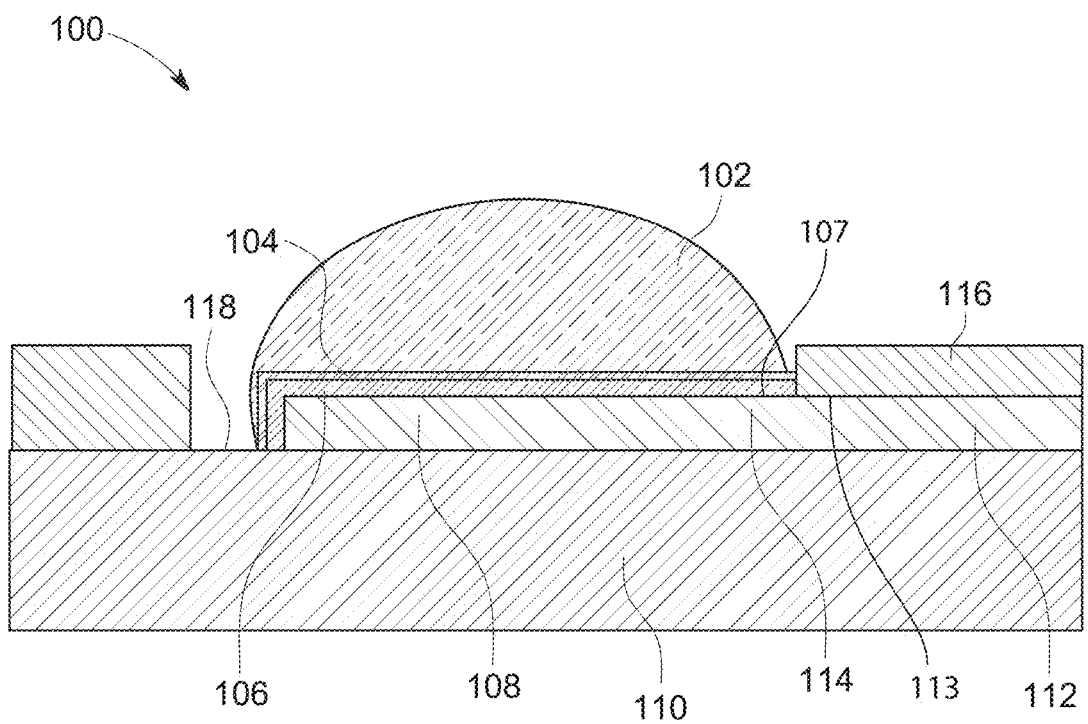
FIG. 1A is a side cross-sectional view of an example ball grid array pad in a first configuration.

Referring to FIG. 1A, there is shown a cross-sectional side view of an example of a BGA pad, generally designated 100, in a first configuration with the trace of a substrate. The BGA pad 100 may be part of an array of pads to which conductive balls such as solder balls 102 are attached and which form a ball grid array used to couple a substrate 110 to a PCB for electrically coupling devices mounted on the substrate (e.g., microprocessors, memory dies, etc.) to the PCB. The BGA pad 100 is formed on a surface of the substrate 110. The BGA pad 100 may include a conductive pad 108 for electrically coupling the BGA pad 100 to a trace 112 of the substrate, and one or more plating layers disposed between the solder ball 102 and conductive pad 108. In some embodiments, the one or more plating layers includes a first plating layer 104 and a second plating layer 106. In some embodiments, the first plating layer 104 may be a gold (Au) plating layer. In some embodiments, the second plating layer 106 may be a nickel (Ni) plating layer. In some embodiments, the conductive pad 108 is a copper pad comprised of copper. In other embodiments, the conductive pad 108 is comprised of any conductive metal or metal alloy. In some embodiments the first plating layer 104 and second plating layer 106 may be integrally formed (e.g., a NiAu plating layer). In other embodiments, the one or more plating layers may include one or more of immersion gold, immersion tin, and/or an organic solderability preservative (OSP). In some embodiments, the first plating layer 104 is disposed below the solder ball 102. In some embodiments, the second plating layer 106 is disposed below the first plating layer 104. In some embodiments, the conductive pad 108 is disposed below the second plating layer 106.

Figure 1B:
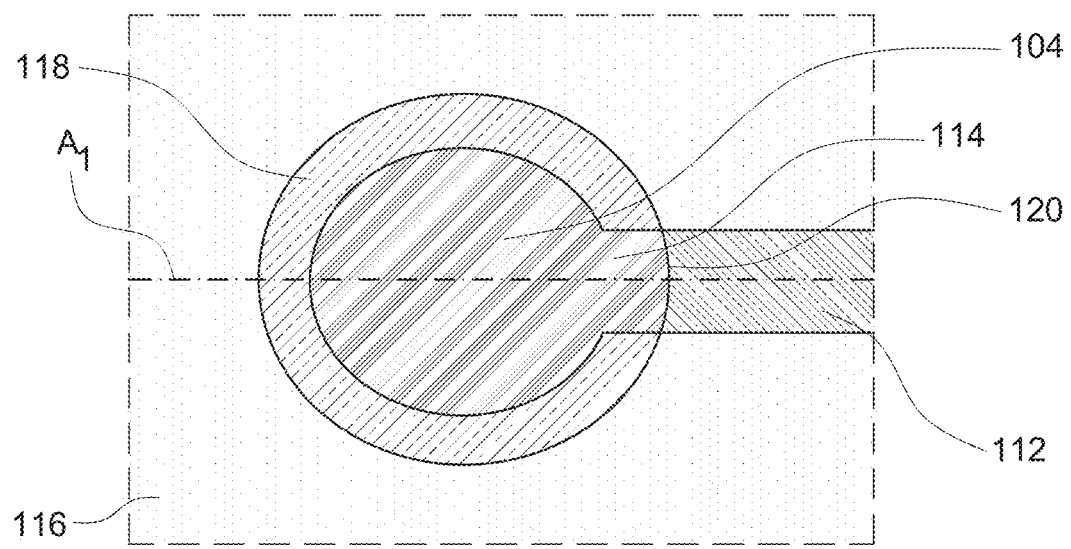
FIG. 1B is a top cross-sectional view of the example ball grid array pad in FIG. 1A FIGS. 2A-2C are top cross-sectional views of ball grid array pads in the first configuration having a multi-surface trace interface in accordance with an exemplary embodiment of the present disclosure.

The substrate 110 may include a trace 112 disposed on the surface of the substrate 110 for conducting electrical signals between devices electrically coupled to the substrate 110. The substrate 110 may include a solder mask 116 disposed above the trace 112 for protection against oxidation and to prevent unintended electrical connections between conducting elements coupled to the substrate. The solder mask 116 may define a solder mask opening 118 in which the BGA pad 100 is positioned. The solder mask opening 118 may have a generally circular cross-section when viewed from the top (as shown in FIG. 1B). The solder mask opening 118 may extend circumferentially around the BGA pad 100. In some embodiments, the solder mask opening 118 is spaced from the BGA pad 100 such that the solder mask 116 is not in direct contact with the conductive pad 108, also referred to as a non-solder mask defined (NSMD) configuration (see FIGS. 1A-1B). In some embodiments, the BGA pad 100 may be in a first configuration in which a portion of one or more layers of the BGA pad 100 extends to an edge of the solder mask 116 and couples to the trace 112 without the solder mask 116 covering said portion. For example, a portion of the first plating layer 104, second plating layer 106 and/or conductive pad 108 may extend to an edge of the solder mask 116. In some embodiments, a bottom surface 107 of the one or more plating layers may be disposed above a top surface 113 of trace 112.

The portion of the one or more layers 104, 106 that extends to an edge of the solder mask 116 and couples to the trace 112 may be referred to as a junction 114. The junction 114, and/or portions of the trace 112 and/or BGA pad 100 proximal the junction 114, may be prone to breakage or separation, which result in the BGA pad 100 being electrically decoupled from trace 112. For example, breaks or separations may occur as a result of the trace 112 and/or one or more of the layers that form junction 114 being so thin that they are more likely to be compromised. Referring to FIG. 1B, there is shown a top cross-sectional view of the BGA pad 100 positioned within an opening of the solder mask 116 having an NSMD configuration. As can be seen, the junction 114 extends from the BGA pad 100 along axis $A_1$ and couples to trace 112. Axis $A_1$ may extend along a length of the trace 112 and be generally centered within the width of trace 112. In some embodiments, axis $A_1$ may extend through a center point of BGA pad 100. In the example shown in FIG. 1B, the junction 114 includes a first interface surface 120, which is the surface of the junction 114 that contacts the trace 112. In FIG. 1B only the first plating layer 104 is visible, however, it will be understood that the second plating layer 106 and conductive pad 108 may be disposed below the first plating layer 104 (as shown in FIG. 1A) such that the second plating layer 106 and conductive pad 108 are included in junction 114. In this example, the first interface surface 120 is an interface defined by a continuous radius of curvature in which no part of the interface extends beyond the radius of curvature. In the example shown in FIG. 1A, the first interface surface 120 is defined by a curve that has no inflection point. The junction 114 may contact trace 112 in an area (not shown) defined by the radius of curvature of the first interface surface 120, the thickness the conductive pad 108, and/or a surface area of the first plating layer 104 and/or second plating layer 106. For example, in the BGA pad 100, the junction 114 contacts trace 112 in an area defined by the radius of curvature of the first interface surface 120 and the thickness of the conductive pad 108. To state differently, only the conductive pad 108 is in direct contact with the trace 112. The conductive pad 108 and trace 112 may be integrally formed.

Figure 5:
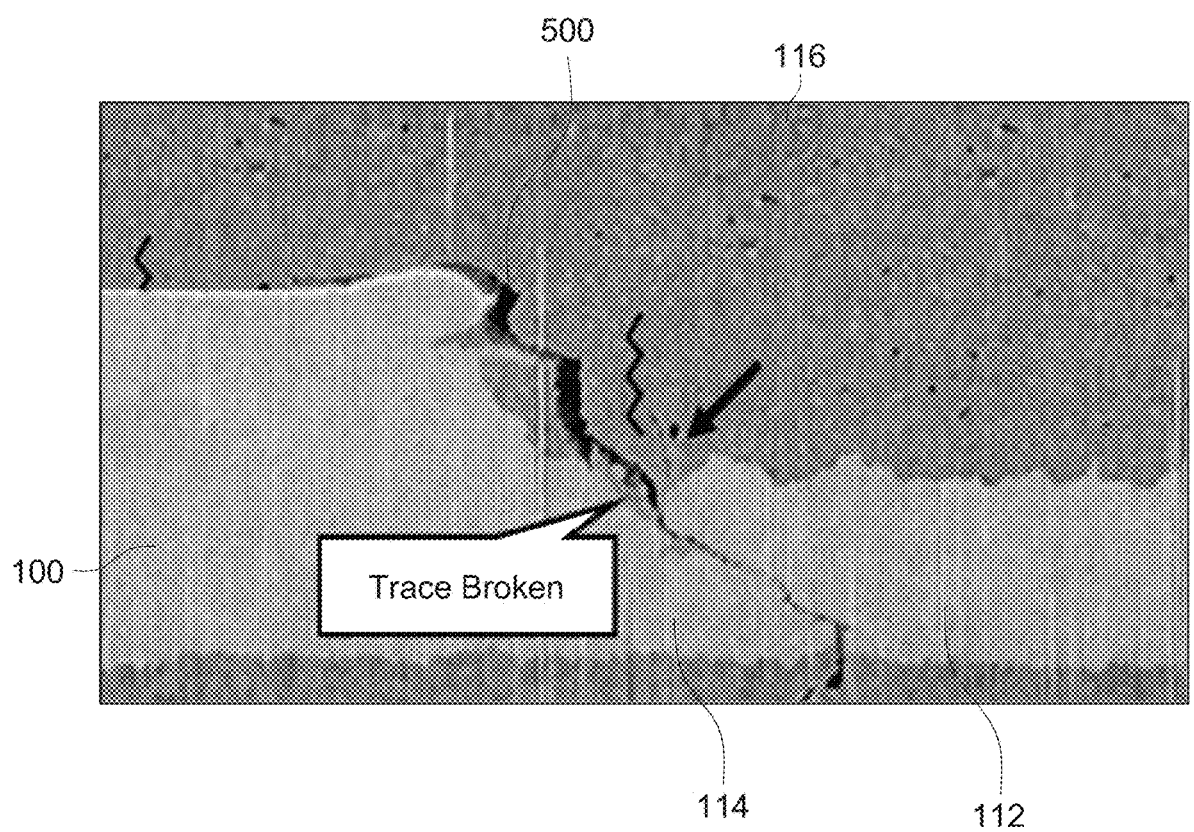
FIG. 5 is a magnified view of a ball grid array pad having a broken metal-to-metal interface with a trace of a substrate.

A configuration as shown in FIGS. 1A-1B may be prone to breaks or cracks between the BGA pad 100 and trace 112, particularly at or proximal the junction 114. For example, as shown in FIG. 5, a break 500 between a BGA pad 100 and trace 112 is shown. The break 500 extends from a top surface of the BGA pad 100, along junction 114 and through trace 112.

Figure 2A:
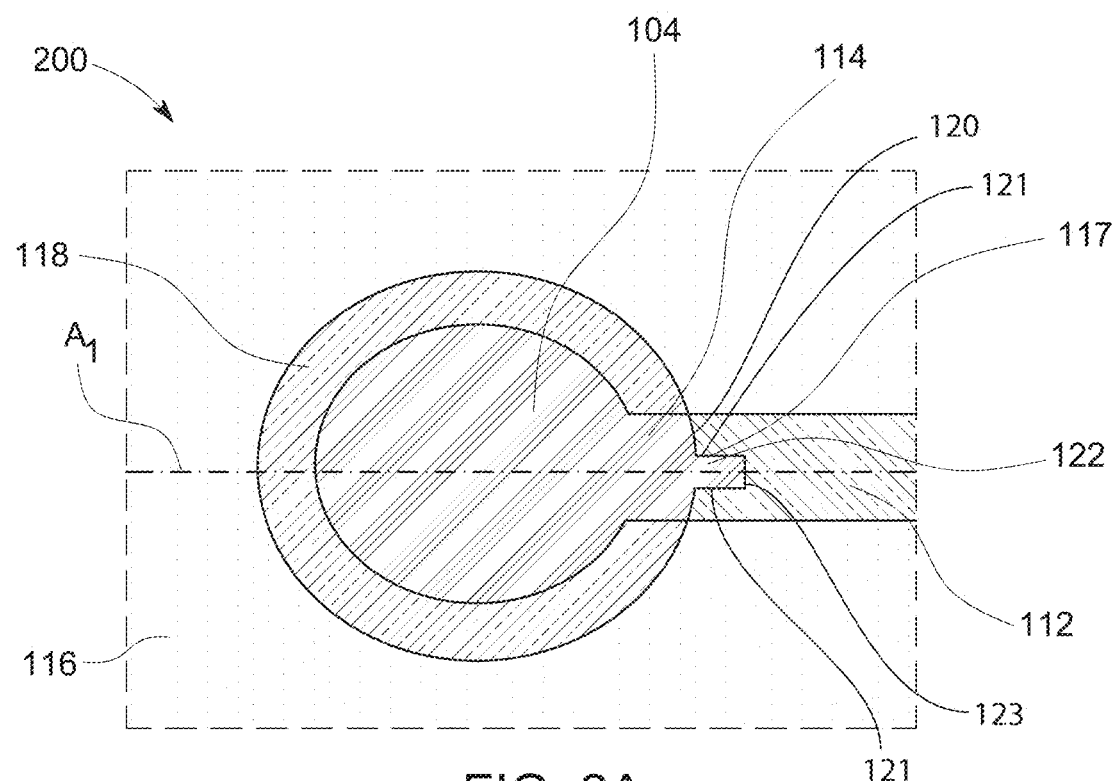
Figure 2B:
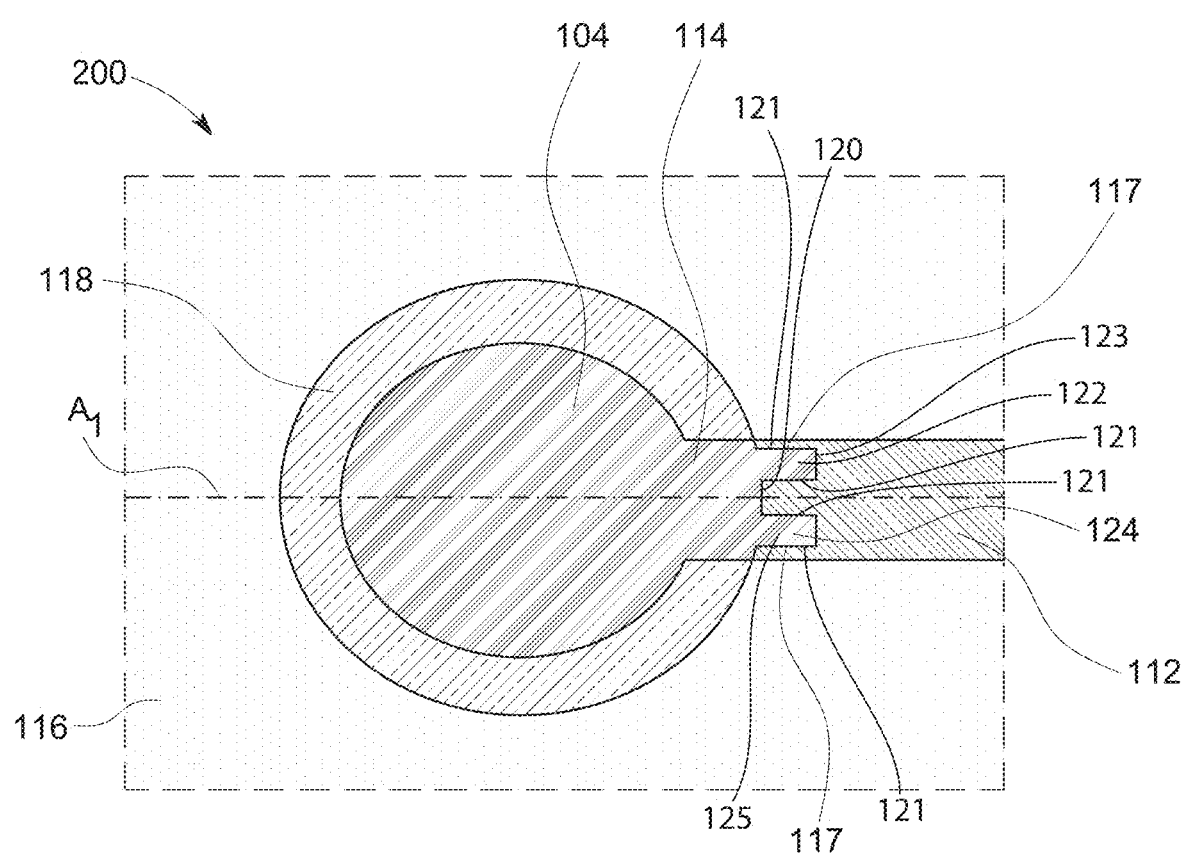
Figure 2C:
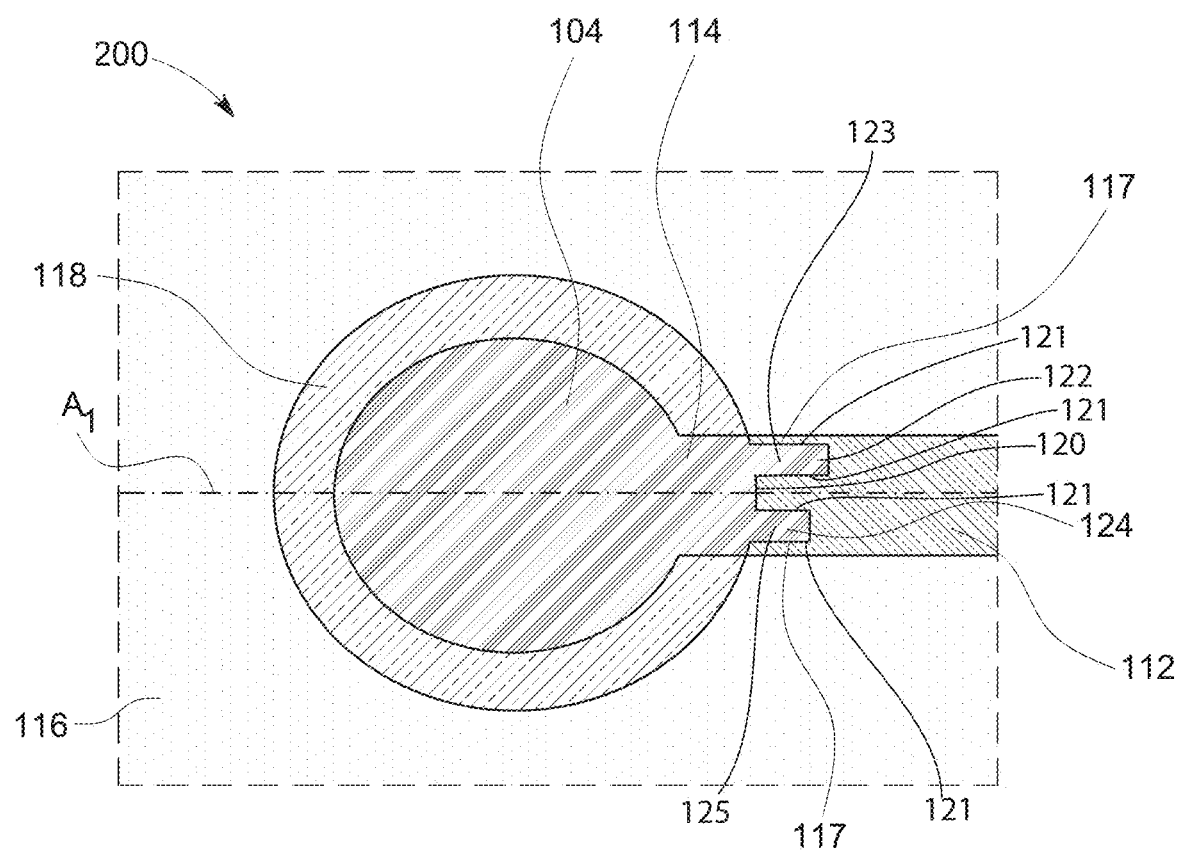

Referring to FIGS. 2A-2C, there is shown exemplary embodiments of a BGA pad 200, in a first configuration, having a junction configured to reduce the occurrence of breaks and/or cracks between the BGA pad 200 and a trace of a substrate, in accordance with the present disclosure. Elements of the pad 200 that are the same or similar to that of the pad 100 are labeled with the same element numbers. The occurrence of breaks and/or cracks may be reduced by increasing the surface area at the interface between the junction 114 and trace 112 as compared to the interface as shown in FIGS. 1A-1B. The BGA pad 200 may include a junction 114 having two or more interface surfaces that are in direct contact with trace 112. For example, referring to FIG. 2A, the junction 114 may include a first interface surface 120 and a second interface surface 122. In some embodiments, the second interface surface 122 is a surface of a protrusion 123 (e.g. a bottom surface or end surface of a protrusion) extending from the first interface surface 120 along axis $A_1$. The second interface surface 122 may be contiguous with the bottom surface 107 of the one or more plating layers. The protrusion 123 may have a width, extending in a direction that is perpendicular to axis $A_1$, which is less than a width of trace 112. The protrusion 123, in some embodiments, may include one or more generally straight portions that extend in a direction that is generally parallel to axis $A_1$. The protrusion 123 may include two parallel sidewalls 121 extending upwardly from the bottom surface 107 of the one or more plating layers. The second interface surface 122 may be comprised of one or more of the first plating layer 104 and/or second plating layer 106. In some embodiments, the second interface surface 122 is formed by providing an aperture 117 in solder mask 116 such that one or more of the first plating layer 104 and second plating layer 106 may extend into the aperture 117. In some embodiments, the aperture 117 in solder mask 116 may be formed by a photo imaging process. In some embodiments, the aperture 117 may be formed prior to plating the first plating layer 104 and/or second plating layer 106 such that a portion of the trace 112 proximate the aperture 117 is not covered by the solder mask 116. In some embodiments, the shape of the second interface surface 122 is defined by the aperture 117. For example, aperture 117 may be formed in the solder mask 116 prior to plating the first plating layer 104 and/or second plating layer 106 such that the second interface surface 122 extends into aperture 117. In some embodiments, the aperture 117 extends from a top surface of solder mask 116 to a bottom surface of solder mask 116. The second interface surface 122 may be configured to directly contact trace 112 such that a bottom surface of the second interface surface 122 contacts a top surface of trace 112.

In some embodiments, the junction 114 may include three or more interface surfaces that are in direct contact with trace 112. For example, referring to FIG. 2B-2C, the junction 114 may include a first interface surface 120, a second interface surface 122, and a third interface surface 124. The second interface surface 122 and third interface surface 124 may be surfaces of a first protrusion 123 and a second protrusion 125, respectively, each extending from the first interface 120 in a direction generally parallel to axis $A_1$. In some embodiments, the second interface surface 122 and third interface surface 124 may be about equally spaced from axis $A_1$. In other embodiments, the second interface surface 122 and third interface surface 124 may be unequally spaced from axis $A_1$. In some embodiments, the second interface surface 122 and third interface surface 124 may extend generally the same length from the first interface surface 120 (as shown in FIG. 2B). In some embodiments, the second interface surface 122 and third interface surface 124 are symmetric about axis $A_1$. In some embodiments, the second interface surface 122 and third interface surface 124 each have a width extending in a direction perpendicular to axis $A_1$. In some embodiments, the combined width of the second interface surface 122 and third interface surface 124 is less than the width of trace 112. In other embodiments, the second interface surface 122 and third interface surface 124 may extend different lengths from the first interface surface 120 (as shown in FIG. 2C). The third interface surface 124 may be comprised of one or more of the first plating layer 104 and/or second plating layer 106. In some embodiments, the solder mask 116 may include two apertures 117 into which the second interface surface 122 and third interface surface 124 extend. The second interface surface 122 and third interface surface 124 may each include a corresponding bottom surface which directly contacts the top surface of trace 112. The second and third interface surfaces shown in FIGS. 2A-2C have a generally rectangular shape, however it will be understood that the shape may be any other shape (e.g., ovular, pill, square, triangular, trapezoidal, semi-circular). In some embodiments, the second interface surface 122 and/or the third interface surface 124 may extend generally parallel to axis $A_1$ from the first interface surface 120 by a distance of about 100 micrometers.

Figure 3A:
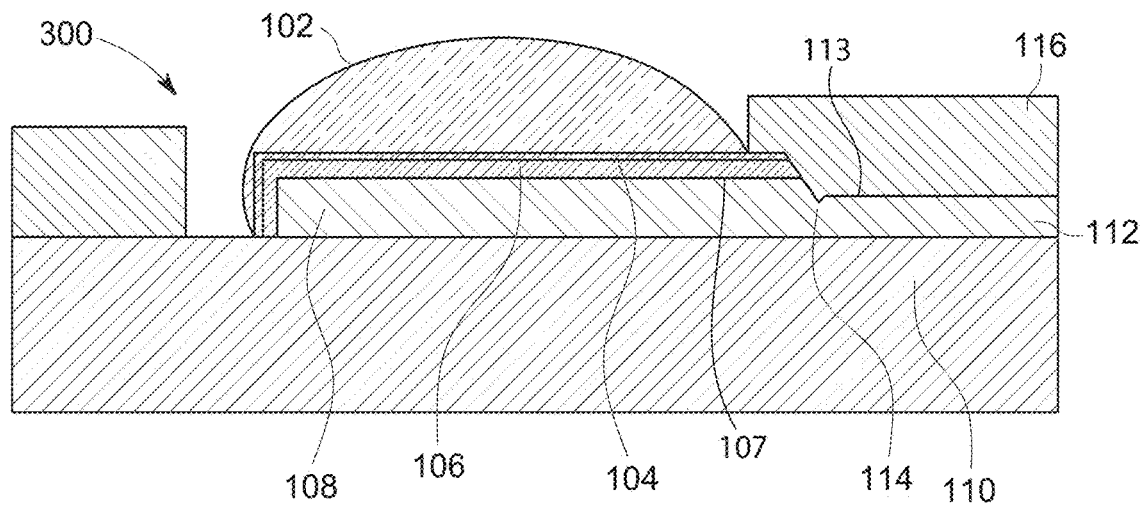
FIG. 3A is a top cross-sectional view of an example ball grid array pad in a second configuration.
Figure 3B:
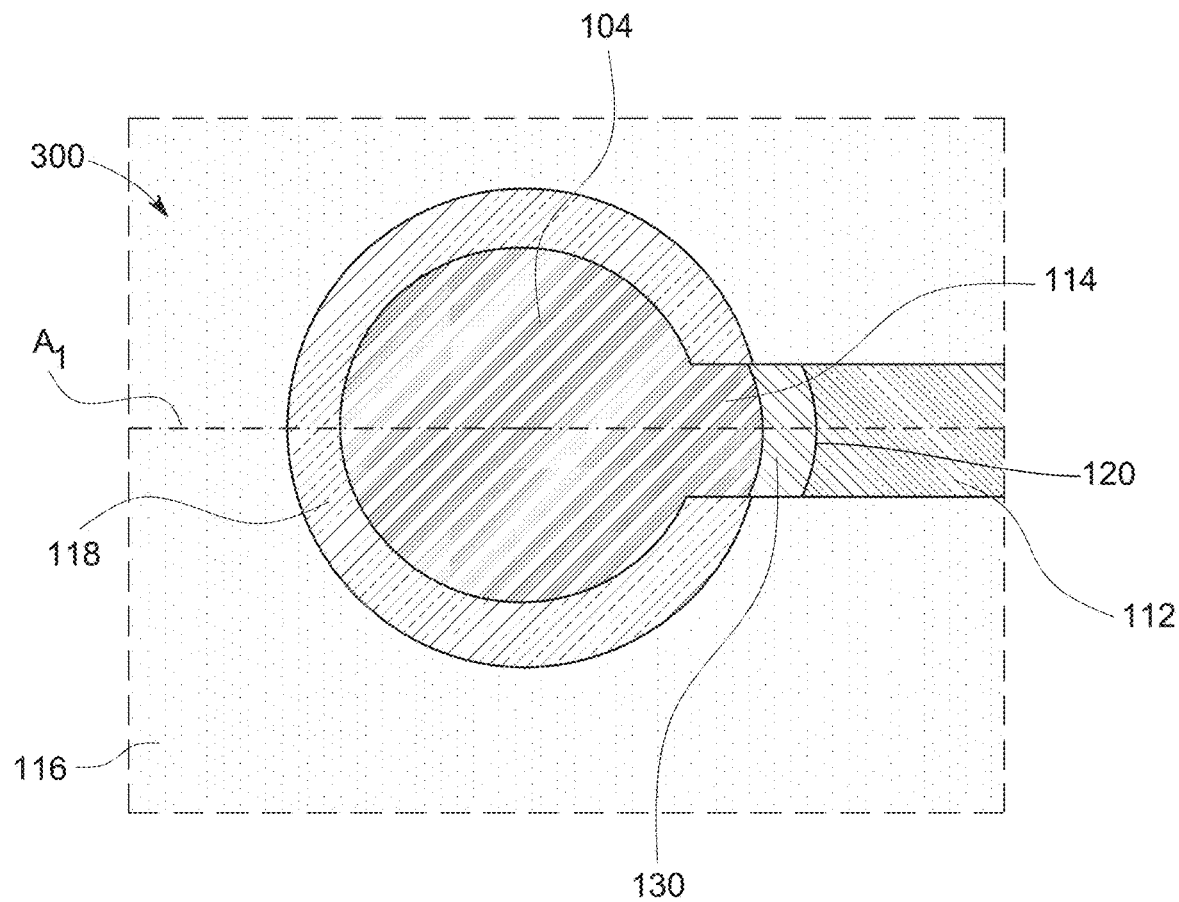
FIG. 3B is a side cross-sectional view of the example ball grid array pad shown in FIG. 3A.

Referring to FIGS. 3A-3B there is shown cross-sectional side and top views of an example BGA pad 300 in a second configuration, which may be the same as the first configuration, except for the layering of solder mask and bond pad plating layers. In the second configuration the junction 114 may be at least partially covered by the solder mask 116. For example, a portion 130 of the first plating layer 104, second plating layer 106, and conductive pad 108 which comprise the junction 114 may be covered by the solder mask 116. In the second configuration, the first and second plating layers 104 and 106 may be plated prior to applying the solder mask 116 such that the solder mask 116 covers a portion of the first and second plating layers 104 and 106.

Figure 4A:
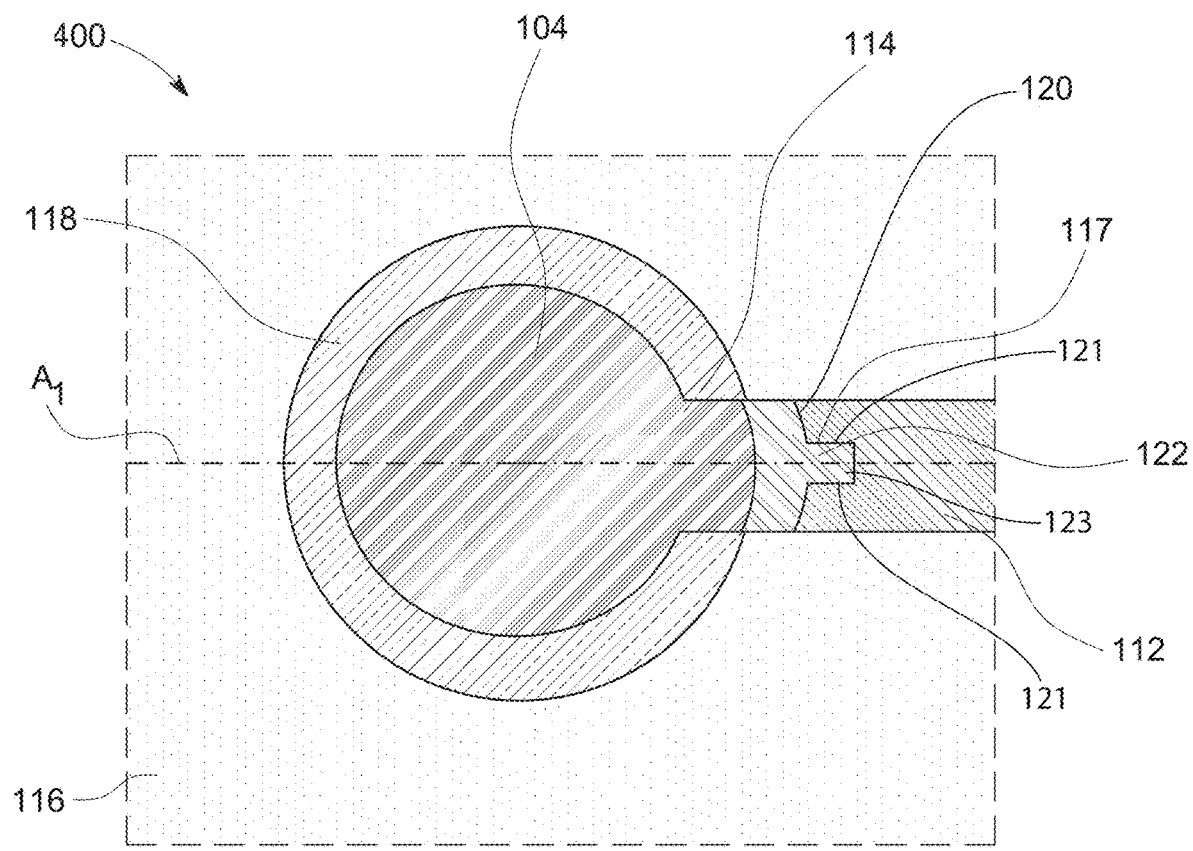
FIGS. 4A-4C are top cross-sectional views of ball grid array pads in the second configuration having a multi-surface trace interface in accordance with an exemplary embodiment of the present disclosure.
Figure 4B:
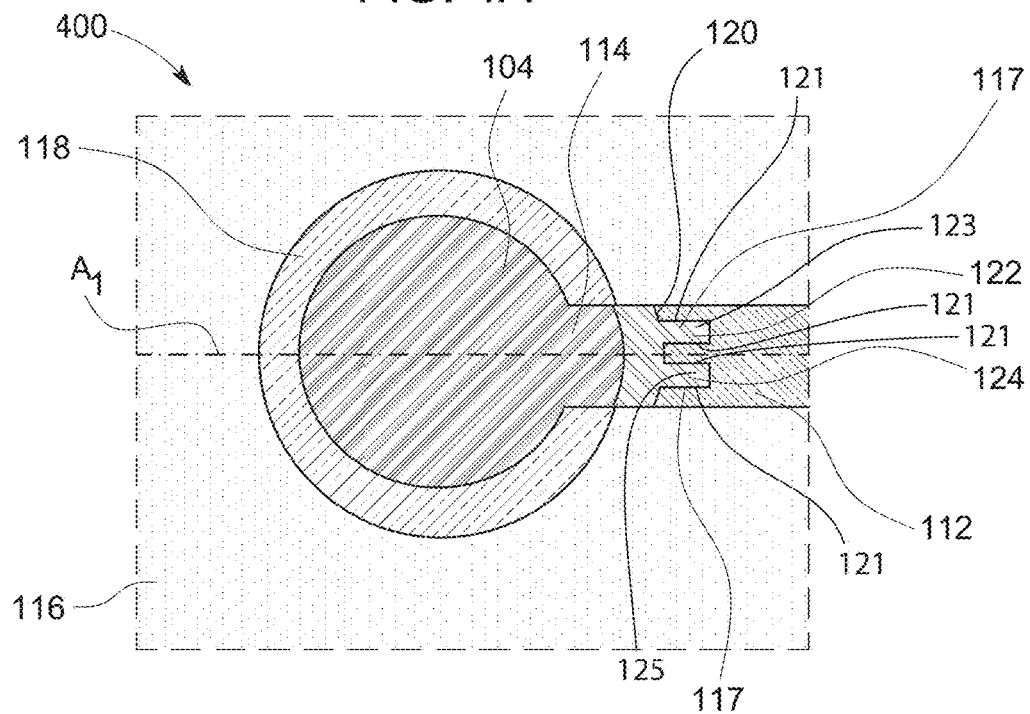
Figure 4C:
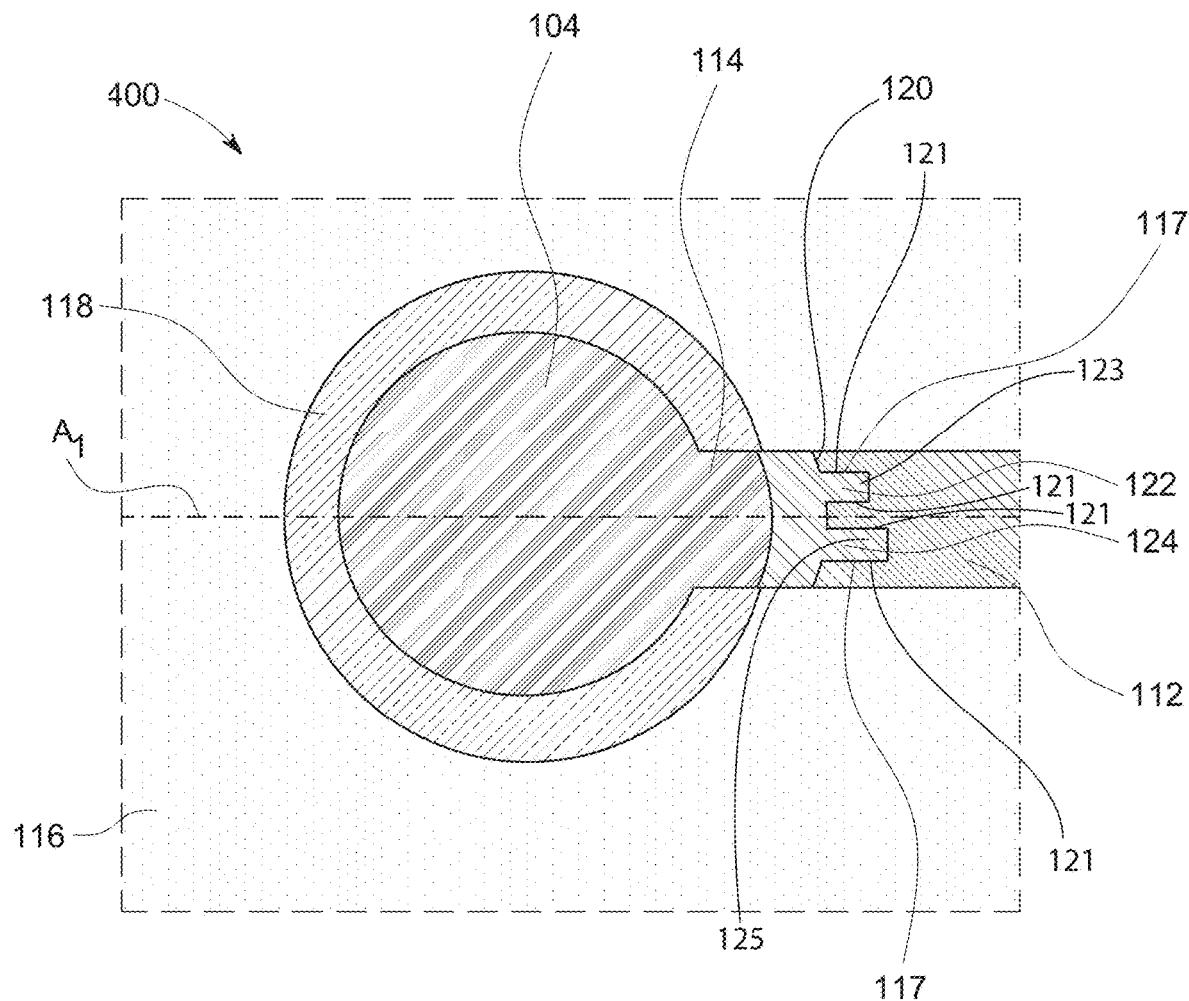

Referring to FIGS. 4A-4C, there is shown exemplary embodiments of a BGA pad 400, in a second configuration, having a junction configured to reduce the occurrence of breaks and/or cracks between the BGA pad 400 and the trace of a substrate, in accordance with the present disclosure. The embodiments shown in FIGS. 4A-4C may be similar to the embodiments shown in FIGS. 2A-2C except that the solder mask 116 at least partially covers the junction 114. Referring to FIG. 4A, the junction 114 may include a first interface surface 120 and second interface surface 122 covered by solder mask 116. In some embodiments, the second interface surface 122 is a surface of a protrusion 123 (e.g., a bottom surface of a protrusion) extending from the first interface surface 120 along axis $A_1$. The second interface surface 122 may be contiguous with a bottom surface 107 of the one or more plating layers. The protrusion 123 may have a width, extending perpendicular to axis $A_1$ which is less than a width of trace 112. The protrusion 123 may include one or more generally straight portions extending parallel to axis $A_1$. The protrusion 123 may include two parallel sidewalls 121 extending upwardly from the bottom surface of the one or more plating layers. The second interface surface 122 may be comprised of one or more of the first plating layer 104 and/or second plating layer 106. In some embodiments, the second interface surface 122 is formed by providing an aperture 117 in solder mask 116 such that one or more of the first plating layer 104 and second plating layer 106 may extend into the aperture 117 and under solder mask 116. In some embodiments, the shape of the second interface surface 122 is defined by the aperture 117. The second interface surface 122 may be configured to directly contact trace 112 such that a bottom surface of the second interface surface 122 contacts a top surface of trace 112.

In some embodiments, the junction 114 may include three or more interface surfaces which are in direct contact with trace 112. For example, referring to FIG. 4B-4C, the junction 114 may include a first interface surface 120, a second interface surface 122, and a third interface surface 124 disposed under solder mask 116. The second interface surface 122 and third interface surface 124 may be surfaces of a first protrusion 123 and a second protrusion 125, respectively, each extending from the first interface 120 in a direction generally parallel to axis $A_1$. In some embodiments, the second interface surface 122 and third interface surface 124 may be about equally spaced from axis $A_1$. In other embodiments, the second interface surface 122 and third interface surface 124 may be unequally spaced from axis $A_1$. In some embodiments, the second interface surface 122 and third interface surface 124 may extend generally the same length from the first interface surface 120 (as shown in FIG. 4B). In some embodiments, the second interface surface 122 and third interface surface 124 are symmetric about axis $A_1$. In other embodiments, the second interface surface 122 and third interface surface 124 may extend different lengths from the first interface surface 120 (as shown in FIG. 4C). The third interface surface 124 may be comprised of one or more of the first plating layer 104 and/or second plating layer 106. In some embodiments, the solder mask 116 may include two apertures 117 into which the second interface surface 122 and third interface surface 124 extend. The second interface surface 122 and third interface surface 124 may each include a corresponding bottom surface that directly contacts the top surface of trace 112. The second and third interface surfaces shown in FIGS. 4A-4C have a generally rectangular shape, however it will be understood that the shape may be any other shape (e.g., ovular, pill, square, triangular, trapezoidal, semi-circular).

It will be appreciated by those skilled in the art that although the disclosure discusses a BGA pad, the pad does not have to be part of a BGA. Rather, alternate configurations of pads could include the features of the BGA pad described above.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "top", "bottom", "lower" and "upper" designate directions in the drawings to which reference is made. The words "inwardly" and "outwardly" refer to directions toward and away from, respectively, the geometric center of the ball grid array having a multi-surface trace interface. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A bonding pad, comprising:
    a conductive pad having a first interface surface in contact with a signal trace of a substrate; and
    a plating layer having a bottom surface in direct contact with the conductive pad, and one or more protrusions extending toward the signal trace in a direction generally parallel to a longitudinal axis of the signal trace, the one or more protrusions having a width extending in a direction perpendicular to the longitudinal axis and which is less than a width of the signal trace, and wherein the one or more protrusions extend into one or more apertures defined by a solder mask of the substrate,
    wherein each of the one or more protrusions include two parallel sidewalls extending upwardly from the bottom surface of the plating layer, and a second interface surface contiguous with the bottom surface of the plating layer, the second interface surface being disposed over and in direct contact with a top surface of the signal trace.

2. The bonding pad of claim 1, wherein the plating layer is a nickel-gold plating layer.

3. The bonding pad of claim 1, wherein the one or more protrusions includes a first protrusion and a second protrusion.

4. The bonding pad of claim 3, wherein the first protrusion and second protrusion extend outwardly from the plating layer generally parallel to one another.

5. The bonding pad of claim 3, wherein the first protrusion and second protrusion extend outwardly from the plating layer at generally the same length.

6. The bonding pad of claim 3, wherein the first protrusion and second protrusion extend outwardly from the plating layer at unequal lengths.

7. The bonding pad of claim 3, wherein the first protrusion and second protrusion are symmetric about the longitudinal axis.

8. The bonding pad of claim 3, wherein the first protrusion has a width extending in a direction perpendicular to the longitudinal axis and second protrusion has a width extending in a direction perpendicular to the longitudinal axis, wherein a combined width of the first protrusion and second protrusion is less than a width of the signal trace.

9. The bonding pad of claim 1, wherein the one or more protrusions have a generally rectangular cross-sectional shape.

10. The bonding pad of claim 1, wherein a top surface of the one or more protrusions is covered by a solder mask of the substrate.

11. A substrate bonding pad, comprising:
conducting means for electrically coupling a solder ball to a trace of the substrate, the conducting means having a first interface means for electrically connecting to the trace; and
plating means covering a surface of the conducting means for protecting the conducting means from corrosion and/or providing strength to the conducting means, the plating means electrically coupling the solder ball to the conducting means, the plating means having protrusion means for directly contacting the trace, the protrusion means having a second interface means for electrically connecting to the trace separate and distinct from the first interface means,
wherein the protrusion means having a width extending in a direction perpendicular to a longitudinal axis of the trace and which is less than a width of the trace, and wherein the protrusion means extend into one or more apertures defined by a solder mask means of the substrate.

12. The substrate bonding pad of claim 11, wherein the plating means comprises a first plating means and a second plating means for directly contacting the trace of the substrate with second and third interface surface areas respectively.

13. The substrate bonding pad of claim 12, wherein the second and third interface surface areas are equal.

14. The substrate bonding pad of claim 12, wherein the second and third interface surface areas are unequal.

15. A substrate, comprising:
an insulating layer configured to provide electrical insulation between electrically conductive elements of the substrate;
a signal trace coupled to a top surface of the insulating layer;
a solder mask in direct contact with a top surface of the signal trace, the solder mask defining a solder mask opening; and
a bonding pad positioned within the solder mask opening, the bonding pad configured to directly contact the signal trace within two or more interface surface areas, the two or more interface surface areas being separate and distinct from one another, the bonding pad comprising:
a conductive pad having a first interface surface in contact with a signal trace of the substrate; and
a plating layer having a bottom surface in direct contact with the conductive pad, and one or more protrusions extending toward the signal trace in a direction generally parallel to a longitudinal axis of the signal trace, the one or more protrusions having a width extending in a direction perpendicular to the longitudinal axis and which is less than a width of the signal trace, and wherein the one or more protrusions extend into one or more apertures defined by a solder mask of the substrate,
wherein each of the one or more protrusions include two parallel sidewalls extending upwardly from the bottom surface of the plating layer, and a second interface surface contiguous with the bottom surface of the plating layer, the second interface surface being disposed over and in direct contact with a top surface of the signal trace.

16. The substrate of claim 15, wherein the solder mask opening includes one or more apertures configured to receive the one or more protrusions of the bonding pad.

17. The substrate of claim 15, wherein the one or more protrusions includes a first protrusion and a second protrusion spaced from one another in a direction perpendicular to the longitudinal axis.

18. The substrate of claim 15, wherein a top surface of the one or more protrusions is covered by the solder mask.

* * * * *